(12) United States Patent
Rostamzadeh et al.

(10) Patent No.: US 9,807,859 B2
(45) Date of Patent: Oct. 31, 2017

(54) COMMON MODE NOISE SUPPRESSION OF SWITCHMODE POWER CONVERTERS BY CAPACITIVE SHIELD WITH DAMPING NETWORK

(71) Applicant: Robert Bosch GmbH, Stuttgart (DE)

(72) Inventors: Cyrous Rostamzadeh, Northville Township, MI (US); Shijie Wang, Windsor (CA); Rajesh Das, Canton, MI (US); Steven Gladstein, Farmington Hills, MI (US); Timothy Foster, Saline, MI (US); Allen Marecki, Plymouth, MI (US); Sanjai Master, Canton, MI (US)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 15/127,691

(22) PCT Filed: Jun. 16, 2014

(86) PCT No.: PCT/US2014/042506
§ 371 (c)(1),
(2) Date: Sep. 20, 2016

(87) PCT Pub. No.: WO2015/142375
PCT Pub. Date: Sep. 24, 2015

(65) Prior Publication Data
US 2017/0181257 A1    Jun. 22, 2017

Related U.S. Application Data

(60) Provisional application No. 61/968,786, filed on Mar. 21, 2014.

(51) Int. Cl.
*H02M 1/00* (2006.01)
*H05B 41/28* (2006.01)
(Continued)

(52) U.S. Cl.
CPC .......... *H05B 41/2806* (2013.01); *H02M 1/12* (2013.01); *H02M 1/42* (2013.01);
(Continued)

(58) Field of Classification Search
CPC ............ H02M 1/12; H02M 1/42; H02M 1/44; H02M 7/003; H02M 2001/123;
(Continued)

(56) References Cited

U.S. PATENT DOCUMENTS 4,686,141 A * 8/1987 Burns ..................... C23C 28/00
174/394
4,863,789 A * 9/1989 Arai ........................ D04B 1/14
174/394
(Continued)

OTHER PUBLICATIONS

International Search Report and Written Opinion for Application No. PCT/US2014/042506 dated Nov. 5, 2014 (10 pages).

*Primary Examiner* — Alexander H Taningco
*Assistant Examiner* — Kurtis R Bahr
(74) *Attorney, Agent, or Firm* — Michael Best & Friedrich LLP

(57) ABSTRACT

A connected light node (CLN) induction light ballast module for powering an induction lamp includes a printed circuit board having components mounted thereon and an earth ground region electrically isolated from a PCB ground region. A heat sink is disposed on a lower layer of the printed circuit board and electrically connected to the earth ground region, wherein a parasitic capacitance occurs between the printed circuit board ground region and the heat sink. A capacitive shield sandwiched by a lower insulating pad and an upper insulating pad is electrically isolated from the heat sink supporting the shield. A damping network electrically connects the capacitive shield to the PCB ground region. Switch-mode power converters are mounted above the upper insulating pad and the shield. The damping network sup-
(Continued)

presses noise by a parasitic capacitance between the PCB ground region and the heat sink during high frequency power converter operation.

19 Claims, 10 Drawing Sheets

(51) Int. Cl.
| | |
|---|---|
| *H05B 37/02* | (2006.01) |
| *H05B 41/24* | (2006.01) |
| *H02M 1/44* | (2007.01) |
| *H02M 1/42* | (2007.01) |
| *H02M 7/00* | (2006.01) |
| *H02M 1/12* | (2006.01) |
| *H05K 1/02* | (2006.01) |

(52) U.S. Cl.
CPC ............ *H02M 1/44* (2013.01); *H02M 7/003* (2013.01); *H05B 37/0272* (2013.01); *H05B 41/24* (2013.01); *H02M 2001/123* (2013.01); *H05K 1/0234* (2013.01)

(58) Field of Classification Search
CPC ............... H05B 37/0272; H05B 41/24; H05B 41/2806; H05K 1/0203; H05K 1/0216; H05K 1/0218; H05K 1/0233; H05K 1/0234

See application file for complete search history.

(56) References Cited

U.S. PATENT DOCUMENTS

| | | | |
|---|---|---|---|
| 5,030,889 A | 7/1991 | El-Hamamsy | |
| 6,178,101 B1 | 1/2001 | Shires | |
| 6,219,239 B1* | 4/2001 | Mellberg | H05K 9/002 |
| | | | 165/80.3 |
| 6,424,099 B1* | 7/2002 | Kirkpatrick | H01J 61/025 |
| | | | 315/246 |
| 6,782,243 B2* | 8/2004 | Shiotsu | H04B 15/00 |
| | | | 343/702 |
| 9,564,275 B2* | 2/2017 | Mehta | H01G 11/24 |
| 2005/0205292 A1 | 9/2005 | Rogers et al. | |
| 2010/0062813 A1 | 3/2010 | Kujanski et al. | |
| 2011/0030900 A1 | 2/2011 | Chen et al. | |
| 2012/0012382 A1* | 1/2012 | McBain | B32B 38/00 |
| | | | 174/388 |
| 2012/0313538 A1* | 12/2012 | Kumar | H05B 41/2806 |
| | | | 315/200 R |
| 2015/0271912 A1* | 9/2015 | Tetsuo | H05K 1/0225 |
| | | | 361/720 |

* cited by examiner

COMMON MODE NOISE SUPPRESSION OF SWITCHMODE POWER CONVERTERS BY CAPACITIVE SHIELD WITH DAMPING NETWORK

RELATED APPLICATIONS

The present application claims priority to U.S. Prov. 61/968,786, filed Mar. 21, 2014, the entire content of which is hereby incorporated by reference.

BACKGROUND

The present invention relates to electromagnetic compatibility of switch-mode power converters of a connected light node induction light ballast module.

Federal Communications Commission (FCC) rules and regulations contained in Title 47 mandates standards that require any electronic system with a switching device operating in excess of 9 kHz, for intentional and unintentional RF transmitters, switching power systems, to comply with FCC following requirements:

(A) Conducted Emission: FCC Part 15 (150 kHz-30 MHz, Average and Quasi Peak Limits). Industrial applications are classified as Class A requirements.

(B) Conducted Emission: FCC Part 18 (450 kHz-30 MHz, for Wireless Light Modules). Industrial applications are classified as Class A requirements.

(C) Radiated Emission FCC Part 15 (30 MHz-1000 MHz, Quasi Peak Limits). Industrial applications are classified as Class A requirements.

The invention is directed to resolving and mitigating EMI non-conformance with respect to Conducted Emission and Radiated Emission requirements per FCC. Class A part 15 and part 18 specifications for a connected light node induction light ballast module providing power to an induction lamp.

Providing a capacitive plate shunt element is a concept that has been considered as a mitigation technique for conducted emission failure by Electromagnetic Compatibility (EMC) experts. However, the inclusion of a capacitive shunt plate increases radiated emission profile and results in radio frequency (RF) noise energy (spectral shift of RF energy content to higher frequencies). More critically, addition of a capacitive plate shunt element may create structural resonances, which will contribute to radiated emission non-compliance. As a result of this, the capacitive plate shunt concept has been avoided.

Creation of any unintended structural radiating antennas, i.e., as a result of a capacitive shield or from a metallic enclosure that alters or modifies the magnitude and direction of common mode RF currents are issues with regard to EMI non-conformance. Thus, such factors must be compensated for to obtain Conducted Emission and Radiated Emission field Compliance.

A mitigation device must be adaptable for application to a large variety of high frequency switching circuits and correlate well with full FCC measurements and standards. The mitigation device and components must employ an arrangement to limit the level of RF currents on external cables of an induction light ballast module to ensure full EMI compliance as per FCC requirements delineated earlier.

SUMMARY

One embodiment of the invention resolves and mitigates for a connected light node (CLN) induction light ballast module, the presence of EMI non-conformance with respect to Conducted Emission and Radiated Emission requirements per FCC Class A part 15 and part 18 specifications. The arrangement is adapted for RF switching power circuits, wherein the change of current di/dt and charge of voltage dv/dt is sudden, for example changing at a frequency of greater than 200 KHz. More specifically, such RF switching power circuits are the source of high frequency energy, and with a parasitic capacitance formed between a printed circuit board (PCB) ground region and an earth ground, which provides an RF current return path for switching frequencies and its entire harmonics. In some embodiments, the PCB ground region contains high frequency switching current and voltage waveforms, such as 210 KHz, and harmonics as high as 200 MHz. A parasitic capacitance of, for instance, 600 pF with one plate at PCB ground and a second plate at AC earth ground is, unfortunately an ideal RF current path for circulation currents. Therefore, all AC input power wires, more specifically an AC Ground wire, behaves as unintentional antenna (Antenna Mode) with high Common Mode RF currents (210 kHz and its higher harmonics up to 200 MHz). The Magnitude of Common Mode Currents would easily exceed 10 micro amps and at higher frequencies is a potential compliance concern for Conducted RF Emission (150 kHz-30 MHz) and Radiated Emission (30 MHz-1000 MHz) per FCC Class. A requirements. Further, output wires from an induction light ballast module are capable of performing as unintentional antennas.

The invention ensures that the level of RF current on CLN induction light ballast module cables (AC input, lamp and all additional cables) is at an RF measured current level $(I_m)<10$ micro amps to ensure full EMI compliance as per FCC requirements delineated. earlier. By maintaining such a low current value FCC requirements are met. In addition, creation of any unintended structural radiating antennas, i.e., as a result of a capacitive shield or from a metallic enclosure that alters or modifies the magnitude and direction of common mode RF currents are accounted for, thus providing Conducted Emission and Radiated Emission field Compliance.

In one embodiment, the invention provides an induction light ballast module for powering an induction lamp comprising: a printed circuit board including an upper layer partitioned into an earth ground region and a printed circuit board ground region, wherein the earth ground region is electrically isolated from the printed circuit board ground region; a heat sink disposed on an opposing lower layer of the printed circuit board and electrically connected to the earth ground region of the printed circuit board, the heat sink dimensioned to extend beyond at least one outer edge of the printed circuit board, and wherein a parasitic capacitance occurs between the printed circuit board ground region and the heat sink; an alternating current receiving connector and an EMT filter disposed on the earth ground region of the printed circuit board; an elongate capacitive shield sandwiched by a lower insulating pad and an upper insulating pad provided on the outwardly opposing faces of the capacitive shield, wherein the capacitive shield and the upper and lower insulating pads are disposed across a length of the heat sink adjacent to at least one edge of the printed circuit board, Wherein the capacitive shield is electrically isolated from the heat sink by the lower insulating pad; a damping network electrically connecting the capacitive shield to the printed circuit board ground region; a rectifier connected to the EMI filter, wherein the rectifier is disposed on the upper insulating pad adjacent to the capacitive shield and electrically isolated from the capacitive shield and the heat sink; a power factor correction circuit connected to the rectifier and disposed on the printed circuit board ground region, and including switch-mode power converters disposed on the upper insulating pad adjacent to the capacitive shield and electrically isolated from the capacitive shield and the heat sink; and an output power inverter circuit connected to the switch-mode power converter, the output power inverter circuit being disposed on the printed circuit board ground region and including switch-mode power converters disposed on the upper insulating pad adjacent to the capacitive shield and electrically isolated from the capacitive shield and the heat sink, wherein a parasitic capacitance occurs between the printed circuit board ground region and the heat sink, and Wherein the capacitive shield and the damping network provide common mode noise suppression.

In another embodiment, the invention provides an induction light ballast module, wherein the output from the output power inverter circuit operates at an RF frequency and the damping network comprises at least one of a resistor and a ferrite that dampens resonance and harmonics to minimize incidental RF broadcast by external cables corrected to the induction light ballast module.

In another embodiment, the induction light ballast module includes a zigbee circuit for wireless communication with other devices; a flyback circuit for providing, power supply voltages to the power factor correction circuit, the output power inverter circuit and the zigbee circuit; and a controller for operating, the circuits and for enabling remote wireless control of the induction light ballast module via the zigbee circuit.

In another embodiment, the induction light ballast module provides an output power of between approximately 300 watts and approximately 500 watts for driving a lamp and the upper layer and the lower layer comprise two of four layers of the printed circuit board.

In another embodiment, the rectifier comprises a bridge rectifier, and the power factor correction circuit comprises four switch-mode power converters, wherein the switch-mode power converters comprise two output power diodes and two field effect transistors. The damping network and the capacitive shield minimize resonant frequencies incidentally output by the switch-mode power converters.

In one embodiment, the induction light ballast module includes thermally conducting fasteners securing the power converters and the printed circuit board to the heat sink, the fasteners enabling thermal conduction from the power converters to the heat sink. Further, the induction light ballast module includes grounding fasteners securing the printed circuit board to the heat sink and electrically connecting the earth ground region of the printed circuit board to the heat sink.

In one embodiment, the switch-mode power converters of the power factor correction circuit comprise two output power diodes and two power factor correction field effect transistors.

In another embodiment, the induction light ballast module includes a temperature sensor for sensing temperature and a controller for controlling operation of the induction light ballast module in response to sensed temperature and the induction light ballast module comprises a connected light node induction light ballast module In one embodiment, the invention provides a connected light node induction light ballast system comprising: a housing; a connected light node induction light ballast module disposed in the housing, the connected light node induction light ballast module comprising: a printed circuit board including an upper layer partitioned into an earth ground region and a printed circuit board ground region, wherein the earth ground region is electrically isolated from the printed circuit board ground region; a heat sink disposed on an opposing lower layer of the printed circuit board and electrically connected to the earth ground region of the printed circuit board, the heat sink dimensioned to extend beyond at least one outer edge of the printed circuit board, and wherein a parasitic capacitance occurs between the printed circuit board ground region and the heat sink; an alternating current receiving connector and an EMI filter disposed on the earth ground region of the printed circuit board; an elongate capacitive shield sandwiched by a lower insulating pad and an upper insulating pad provided on the outwardly opposing faces of the capacitive shield, wherein the capacitive shield and the upper and lower insulating pads are disposed across a length of the heat sink adjacent at least one edge of the printed circuit board, wherein the capacitive shield is electrically isolated from the heat sink by the lower insulating pad; a damping network electrically connecting the capacitive shield to the printed circuit board ground region; a rectifier connected to the EMI filter, wherein the rectifier is disposed on the upper insulating pad adjacent to the capacitive shield and electrically isolated from the capacitive shield and the heat sink; a power factor correction circuit connected to the rectifier and disposed on the printed circuit board ground region, and including switch-mode power converters disposed on the upper insulating pad adjacent to the capacitive shield and electrically isolated from the capacitive shield and the heat sink; and an output power inverter circuit connected to the switch-mode power converter, the output power inverter circuit being disposed on the printed circuit board ground region and including switch-mode power converters disposed on the upper insulating pad adjacent to the capacitive shield and electrically isolated from the capacitive shield and the heat sink. The connected light node induction light ballast system also includes an induction lamp secured to a bottom of the housing and controlled by the connected light node induction light ballast module, wherein a parasitic capacitance occurs between the printed circuit board ground region and the heat sink, and wherein the capacitive shield and the damping network provide common mode noise suppression.

In another embodiment, the output from the output power inverter circuit of the induction light ballast system operates at an RF frequency of greater than 200 KHz for powering the induction lamp.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
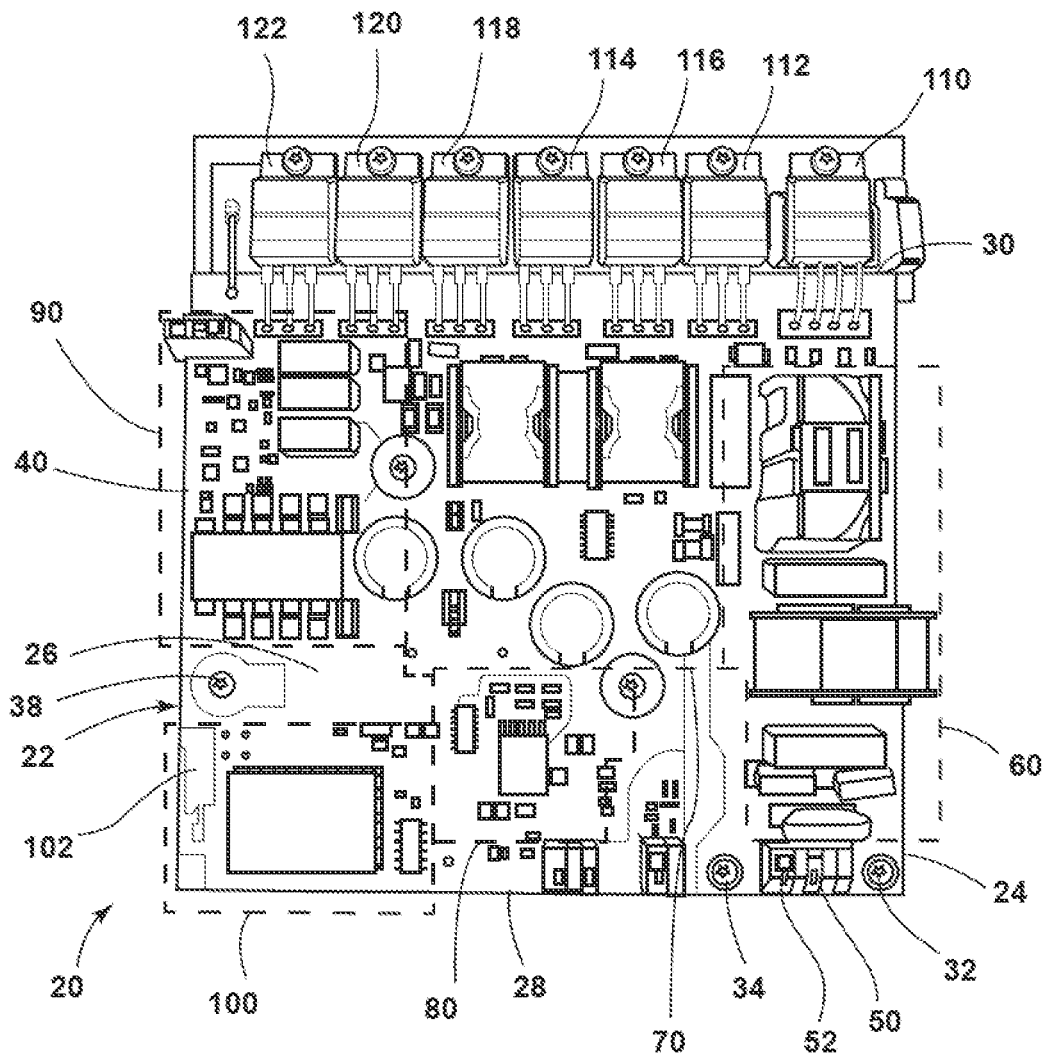
FIG. 1 is a top view of a printed circuit board and components of a connected light node induction light ballast module.

FIG. 1 shows major components of a CLN induction light ballast module 20 that, in some embodiments, acts as a switching power device operating at 210 KHz switching frequency. The arrangement shown in FIG. 1 includes a printed circuit board 22 divided into an earth ground region 24 and a printed circuit board (PCB) ground region 26. In one embodiment, the printed circuit board is a four layer board including an upper layer receiving the components as illustrated in FIG. 1. A printed circuit board lower layer (not shown) is a solid copper providing, a return plane in one embodiment. The inner layers (not shown) are dedicated to signal and power nets for best EMI practices to reduce crosstalk and provide optimum signal integrity.

As shown in FIG. 1, the printed circuit board 22 includes a front edge 28 and a rear edge 30. Further, the printed circuit board 22 includes earth ground region apertures 32, 34 and PCB ground region apertures 36, 38, 40.

The induction light ballast module 20 of FIG. 1 includes a plurality of components mounted onto the top layer of the printed circuit board 22. The components include an AC power supply connector 50 for receiving a mains power supply cable including an AC voltage wire and an AC neutral wire from an AC mains power supply (not shown). Further, an AC ground wire connector 52 is disposed on the printed circuit board 22 for receiving a ground wire of the AC mains power supply.

The induction light ballast module 20 includes an electromagnetic interference (EMI) filter 60 labeled in broken line as a box containing a plurality of components including capacitors and inductors. The EMI filter is mounted to the. earth ground region 24 of the printed circuit board 22 and operates in a known manner.

The induction light ballast module 20 includes an active power factor correction (PFC) circuit 70 mounted to the PCB ground region 26 of the printed circuit board 22. The power factor correction circuit 70 includes capacitors and various components and operates in a known manner.

The induction light ballast module 20 includes a lower power flyback circuit 80 mounted to the PCB ground region 26 of the printed circuit board 22. The flyback circuit SO provides a power supply voltage to the PFC circuit 70, an output power inverter circuit 90 and a zigbee circuit 100. The flyback circuit 80 includes various electrical components and operates in a known manner.

The output power inverter circuit 90 of the induction light ballast module 20 is mounted to the PCB ground region 26 of the printed circuit board 22. The output power inverter circuit 90 includes various electrical components and operates in a known manner to provide an output voltage to a lamp.

A 2.4 GHz Zigbee circuit 100 of the induction light ballast module 20 is mounted to the PCB ground region 26 of the printed circuit board 22. The Zigbee circuit 100 includes a printed circuit 102 that provides for wireless communication with other devices. Further, a microprocessor (not shown in FIG. 1) is disposed in or near the broken line box 100 defining the Zigbee circuit. The microprocessor controls the operation of the induction light ballast module 20.

The induction light ballast module 20 includes a plurality of power converters, including switch-mode power converters. The power converters include a bridge rectifier 110. The power factor correction circuit 70 includes or is associated with a pair of converters comprising PFC field effect transistors (FETs) 112, 114 and a pair of PFC power diodes 116, 118. Further, the output power inverter circuit 90 includes or is associated with a pair of output power inverter field effect transistors (FETs) 120, 122. Other types of transistors and power converters are contemplated.

Figure 2:
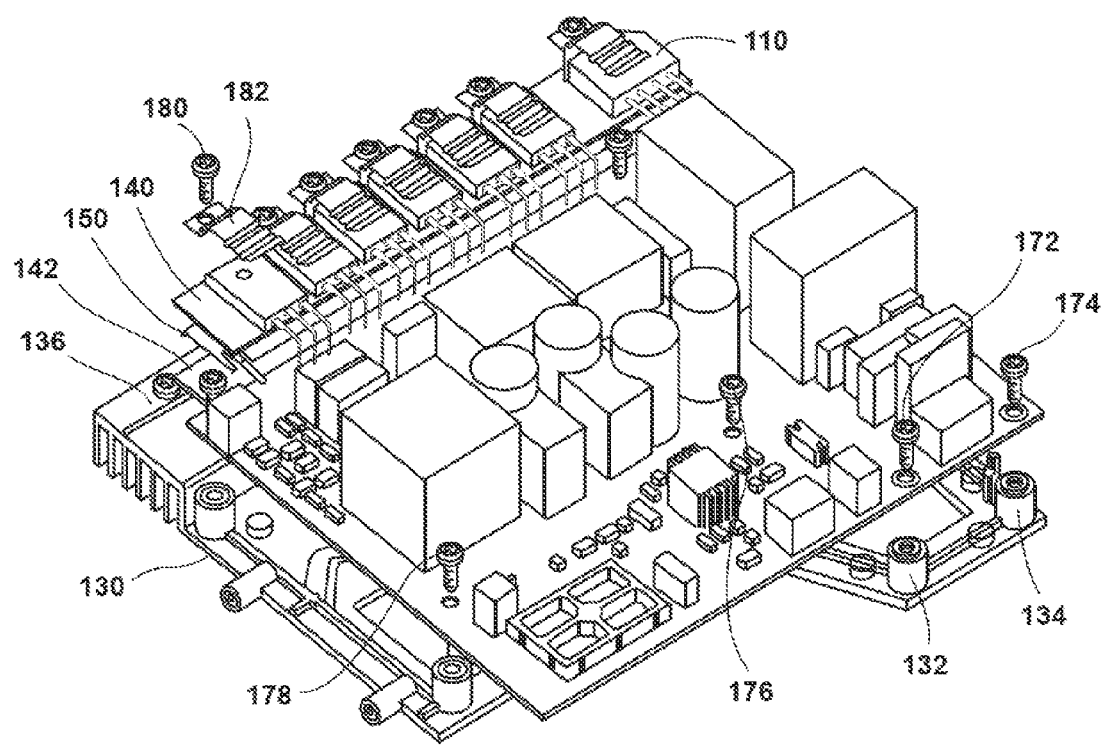
FIG. 2 is a perspective view of the printed circuit board disassembled from a heat sink and a capacitive shield.

FIG. 2 shows the CLN induction light ballast module 20 including a heat sink 130. The heat sink 130 includes fastener receiving, elements 132, 134 and a heat sink rear region 136 extending outwardly and rearwardly beyond the rear edge 30 of the printed circuit board 22. For safety, the heat sink 130 is electrically bonded to chassis ground, an AC ground wire joined to the AC ground wire connector 52. The electrical bonding is essential for the prevention of electrical shock.

Figure 3:
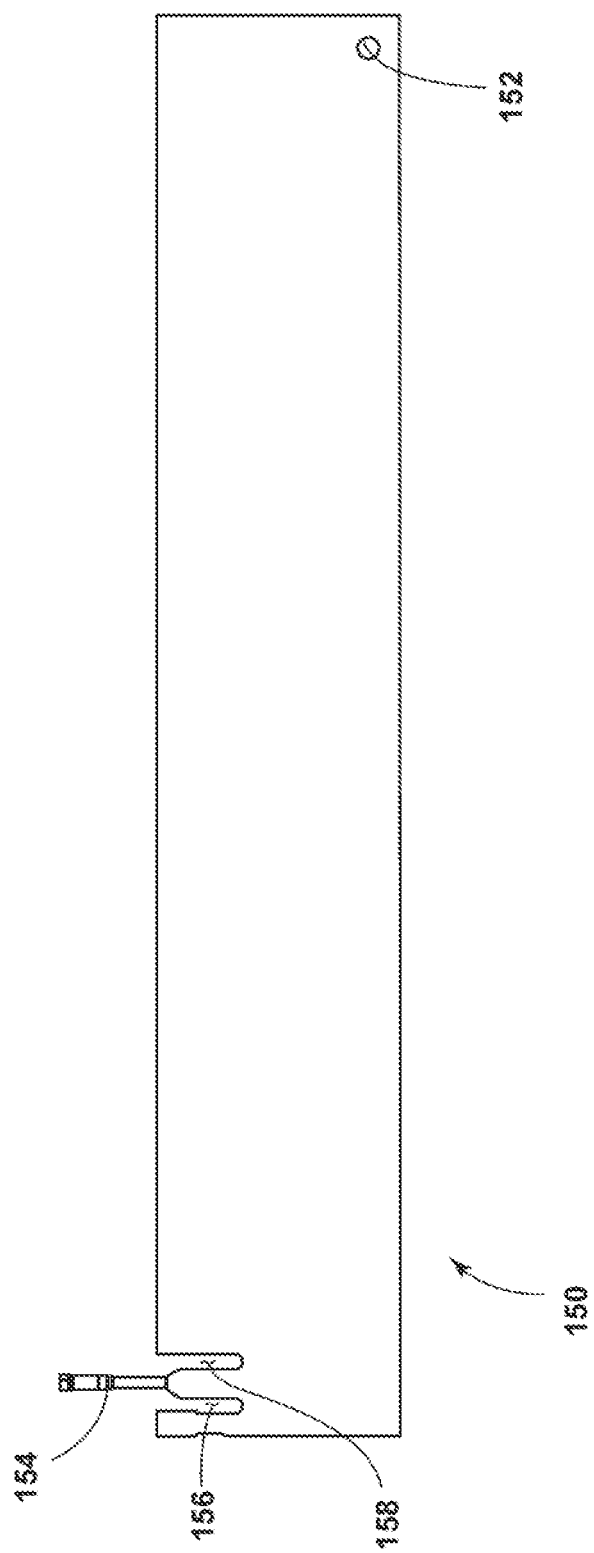
FIG. 3 is a bottom view of the capacitive shield.

FIG. 2 shows an upper SIL pad 140 and a lower SIL pad 142 that act as insulating pads surrounding or enclosing an elongate capacitive shield 150. The capacitive shield 150 includes a mounting aperture 152 and an electrical connector element 154 projecting outwardly. The electrical connector element 154 is also defined by with parallel opposing slots 156, 158 extending into the capacitive shield 150 as shown in FIG. 3. The capacitive shield 150 is a thin conductive metal plate made from copper or other conductive materials.

Figure 4:
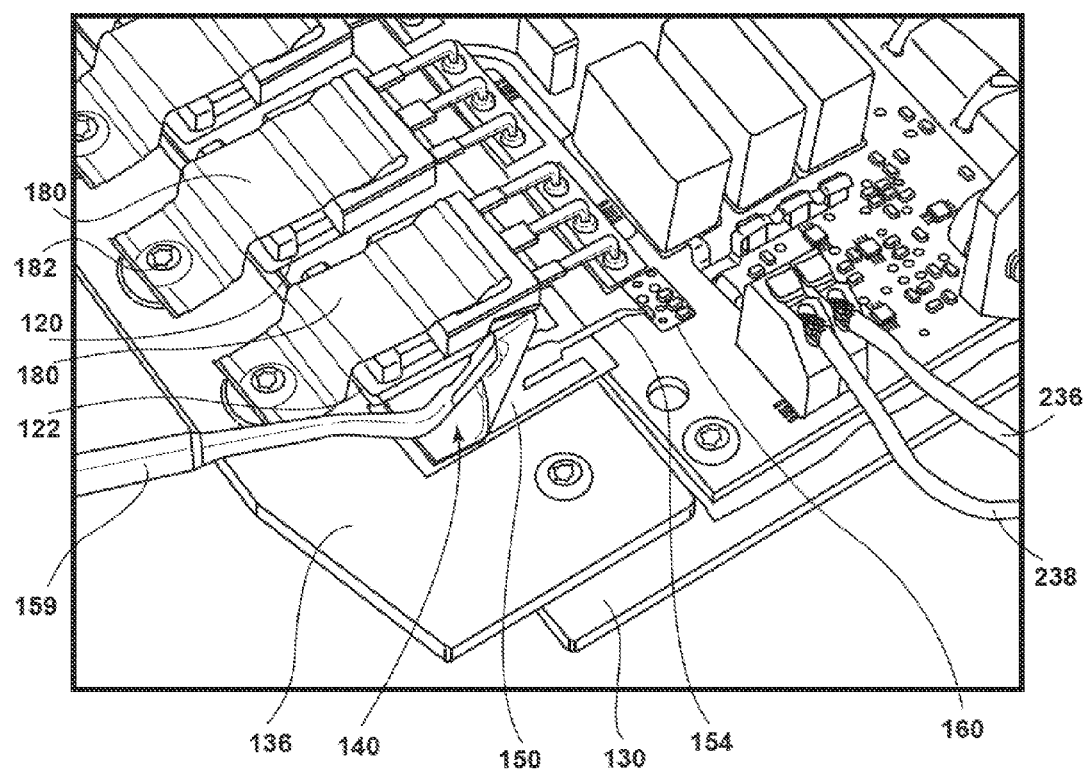
FIG. 4 is a perspective partial view of the printed circuit board with components and the heat sink.

FIG. 4 shows a tool 159 lifting upwardly a portion of the upper SIL pad 140 to show the capacitive shield 150 disposed on the lower SIL pad 142. Thus, FIG. 4 shows the lower SIL pad 142 is in surface-to-surface contact with the heat sink rear region 136. FIG. 4 also shows how the capacitive shield 150 is disposed with a first surface contacting the opposing surface of the lower SIL pad 142 and a second opposing surface contacting a surface of the upper SIL pad 140. While the heat sink rear region 136 in FIG. 4 is shown as a metal plate secured to a portion of the heat sink 130, in some embodiments, the heat sink and the heat sink rear region 136 are a monolithic structure. FIG. 4 also shows the output inverter FETs 120, 122 secured to the upper SIL pad 140, and thus insulated from the capacitive shield 150.

As shown in FIGS. 1 and 2, the rectifier 11 and the power converters 112, 114, 116, 118, 120, 122 are mounted to the upper SIL pad 140.

Figure 5:
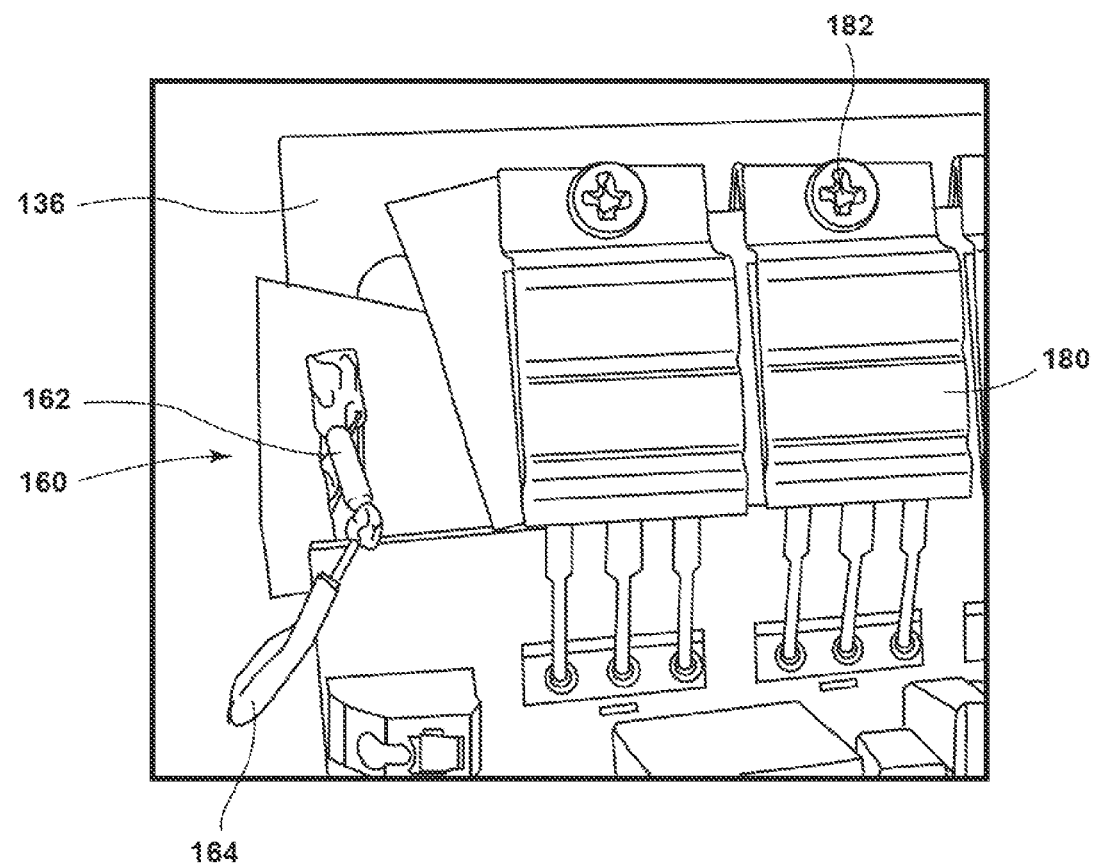
FIG. 5 is a top partial view of the printed circuit board and a damping network.

FIG. 5 is an expanded view of the left top corner of FIG. 1 illustrating a damping network 160 that includes a resistor 162 electrically connected to the electrical connector element 154 and a wire 164 electrically connected to the PCB ground region 26 of the printed circuit board 22. The network 160 includes a ferrite or other elements in different embodiments. The resistor 162 has a value of about 10 ohms in some embodiments.

Returning to FIG. 2, fasteners 172, 174 provide an electrical and a thermal connection between the AC ground wire connector 52 via a printed circuit within the printed circuit board 22. Thus, an AC earth ground wire of an AC power supply to the induction light ballast module 20 provides an earth ground to the earth ground region 24 of the printed circuit board 22 and to the heat sink 130 supporting the printed circuit board.

FIG. 2 shows a pair of fasteners 176, 178 that secure the printed circuit board 22 to the heat sink 130. While the fasteners 176, 178 provide a thermal connection, there is no electrical ground connection between the printed circuit board 22 and the heat sink 130.

FIGS. 2 and 3 show a plurality of fasteners 180 and plates 182 that secure the SIL pads 140, 142, the capacitive shield 150, the bridge rectifier 110, and the power converters 112, 114, 116, 118, 120, 122 to the heat sink 130 through receiving elements (not shown) provided therein. The fasteners 180 provide a thermal connection between the power converters and the heat sink 130. No electrical ground connection is provided between any of the power converters, the capacitive shield 150, the SIL pads with each other or with the heat sink 130. Thus, the PCB ground region 22 acts as a reference plane for the active PFC circuit 70, the output power inverter circuit 90, the flyback circuit 80 and the 2.4 GHz Zigbee circuit 100. The earth ground region 24 is electrically isolated from PCB ground region 22.

Figure 6:
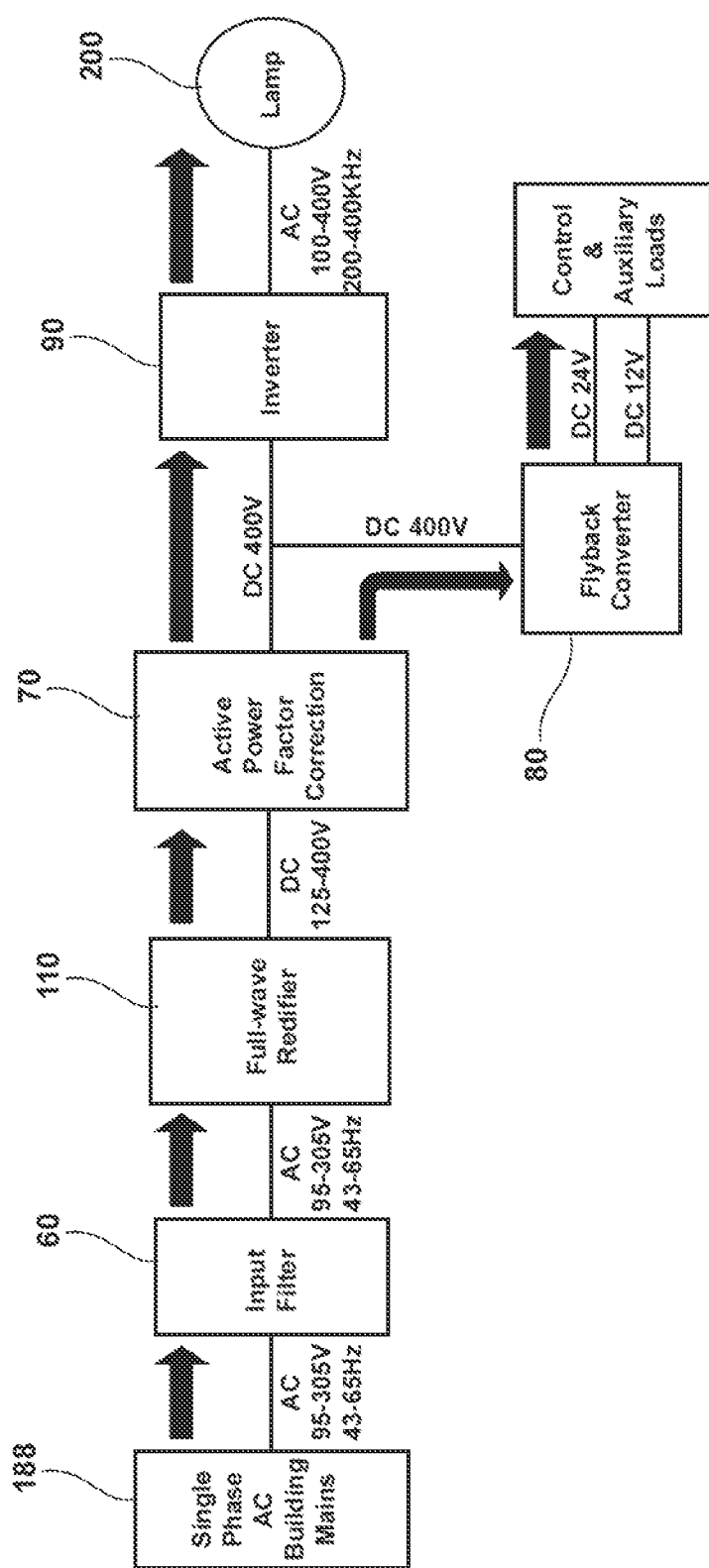
FIG. 6 is a block diagram and flowchart for the connected light node induction light ballast module.

FIG. 6 illustrates the block diagram of the operation of the CLN induction light ballast module 20. The arrangement is based on the integration of capacitive shield 150 with the damping, network 160 in active power factor correction. FIG. 6 shows a single phase AC building mains power supply 188 that supplies AC power to the EMI filter circuit 60. The EMI filter circuit 60 provides the power to the full-wave bridge rectifier 110. The full-wave bridge rectifier 110 provides DC voltage to the active PFC circuit 70. The PFC circuit 70 provides power to the flyback circuit 80 and to the power inverter circuit 90. The flyback circuit 80 provides power to a controller and auxiliary loads 190. The power inverter circuit 90 provides a high frequency AC power at 200-400 KHz to an induction lamp 200.

Figure 7:
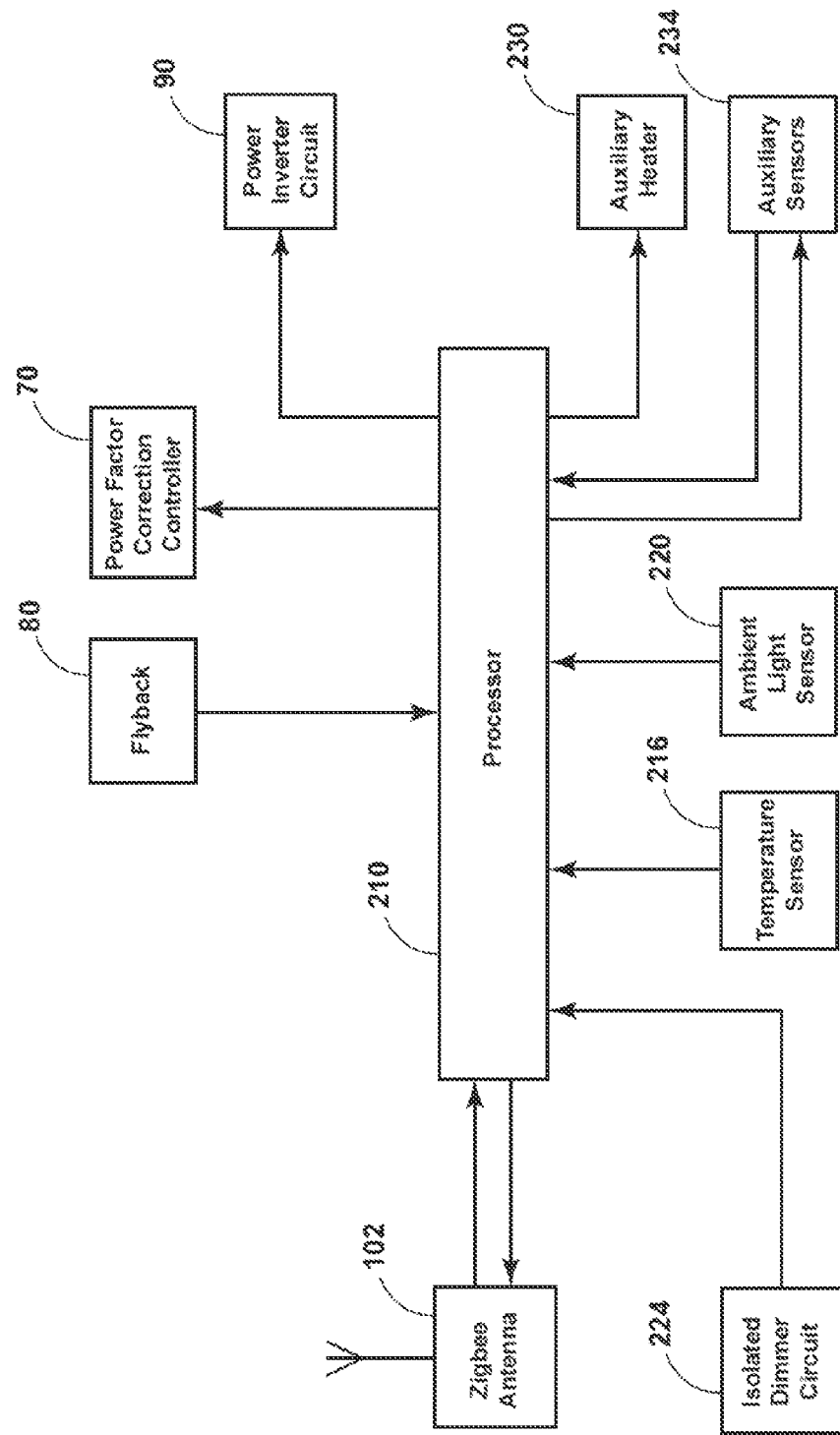
FIG. 7 is a block diagram of a processor connected to associated circuits of the induction light ballast module.
Figure 8:
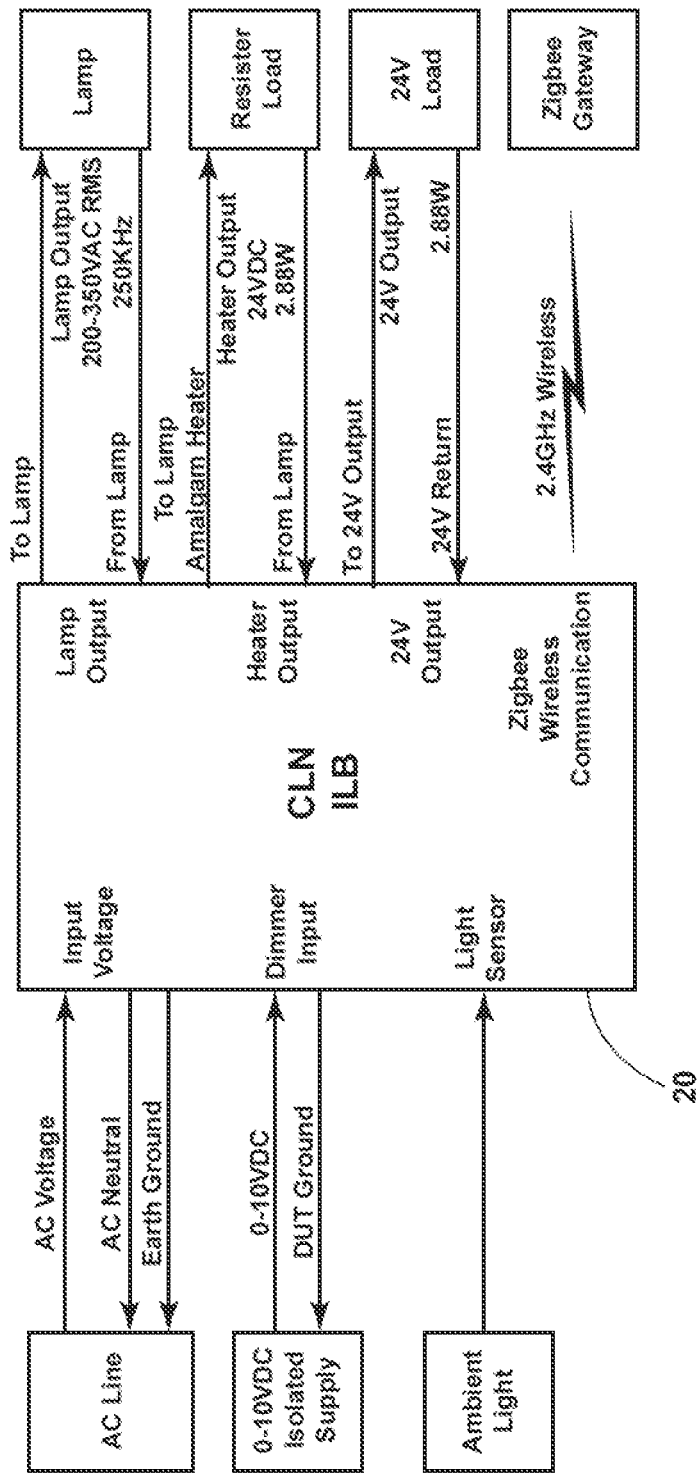
FIG. 8 is a block diagram of the connected light node induction light ballast module and devices connected thereto.

FIG. 7 shows a processor 210 for the CLN induction light ballast module 20. ASIC, microprocessors and other types of controllers are also contemplated. The processor 210 is in two way wireless communication with other wireless lamps and other devices via the Zigbee antenna 102. Further, the processor 210 receives power from the flyback circuit 80 and controls operation of the PFC circuit 70 and the power inverter circuit 90. The processor 210 receives inputs from a temperature sensor 216 and an ambient light sensor 220 and an isolated dimmer circuit 224. Further, in some embodiments the processor 210 controls an auxiliary heater 230 of the induction lamp 200 and communicates with auxiliary sensors 234. Thus, the processor 210 controls the power output by the induction light ballast module 20 in view of many factors. FIG. 8 shows the inputs and outputs of the induction light ballast module 20 and a detailed explanation is not necessary. The resistor load represents the auxiliary heater 234 shown in FIG. 7 for heating the induction lamp 200 to enable proper operation thereof.

Determining the Damping Network

In operation, the power converters 112, 114, 116, 118, 120, 122 of the CLN induction light ballast module 20 strongly influence and generate RF energy, including various high frequency signals and thermal energy. In some embodiments, the output power requirements range from 300 Watts to 500 Watts with efficiency in excess of 90%. The high frequency signals, and harmonics of signals processed by the power converters, must not incidentally broadcast via the A/C input wires providing power to the CLN induction light ballast module 20 due to the A/C input wires acting as an antenna. Further, similar high frequency voltage signals must not incidentally broadcast via the output power wires 236, 238 of the CLN induction light ballast module 20 illustrated in FIG. 4. The output power wires 236, 238 connect to the induction lamp 200. Additional wires (not shown) provide power to an auxiliary heater must not broadcast RF signals.

The operation includes providing the capacitive shield 150 to the induction light ballast module 20 in combination with a specific damping network 160. Measuring the impedance of the capacitive shield 150 with respect to the PCB Ground 26 and the earth ground region 24 corresponding to the heat sink 130 enables determination of resonance(s) of the impedance of the capacitive shield to assist in determining/calculating of a damping network "resistive" and/or, a frequency dependent device, i.e., "ferrite" for damping the RF energy. Thus, for example, the damping network mounted on the PCB ground region may comprise a 0603 SMD resistor, 0603 Ferrite (MuRata BLM series ferrite), or a resistor-ferrite combination placed in series between the capacitive shield 150 and the PCB ground region 26.

In regard to thermal management, the fasteners 180 and the plates 182 allow the transfer of thermal energy from the high power, power converters to the heat sink 130 grounded to the earth ground region 24. Other high temperature components are also thermally connected to the heat sink 130.

Figure 9:
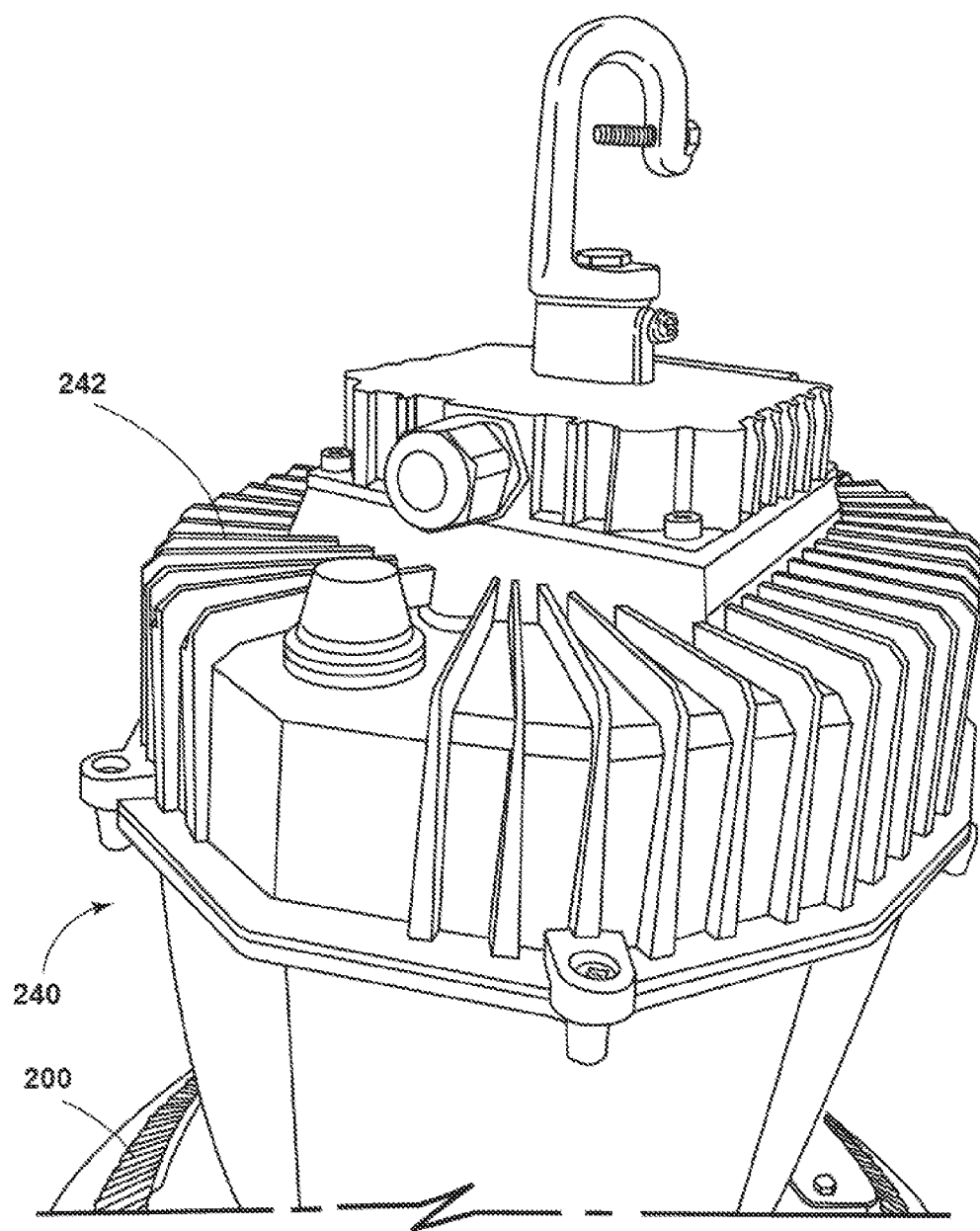
FIG. 9 shows a perspective view of connected light node induction light ballast system.
Figure 10:
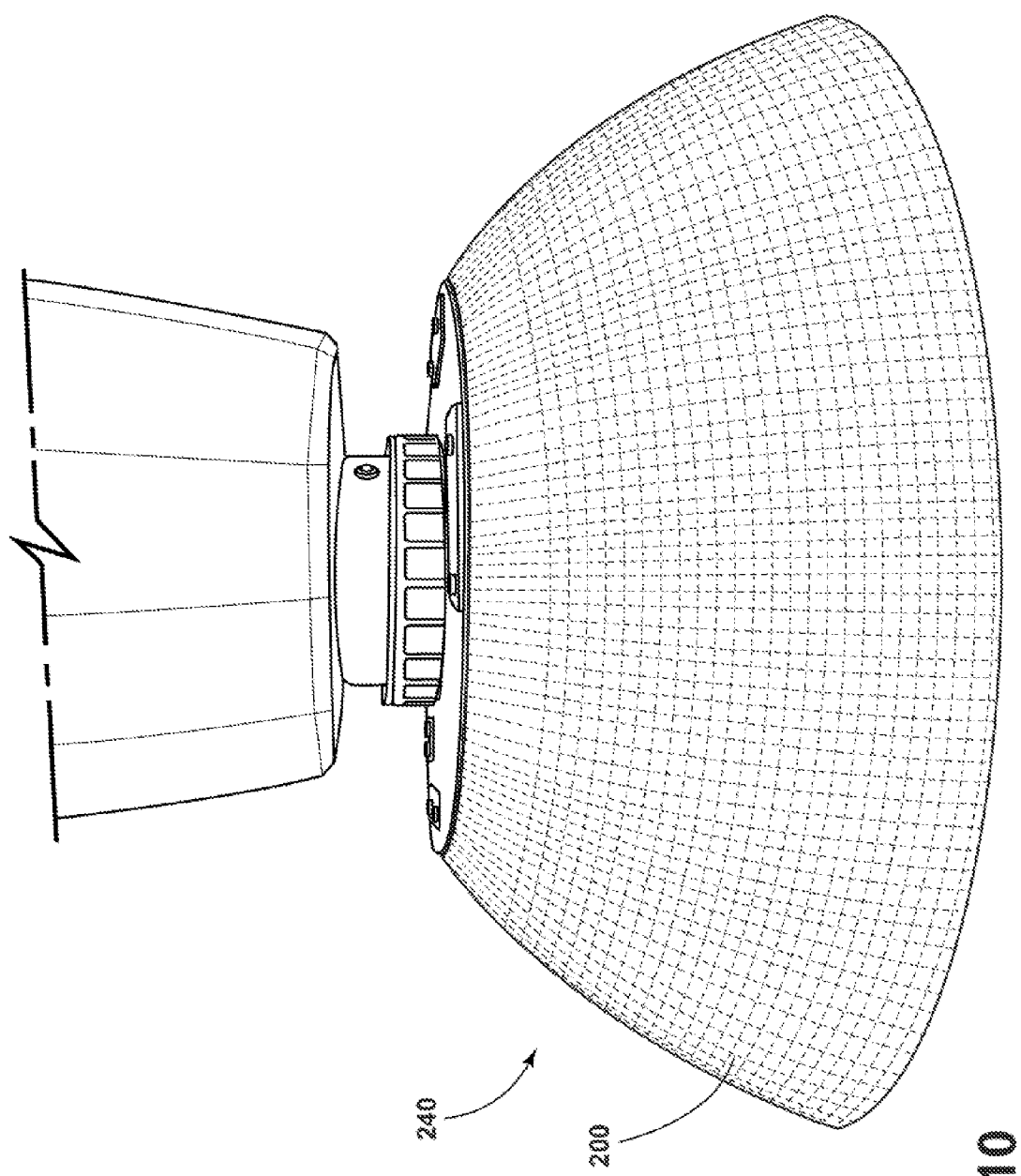
FIG. 10 shows another perspective view of connected light node induction light ballast system.

FIG. 9 shows an induction light ballast system 240 including an induction light ballast module housing 240 that contains the CLN induction light ballast module 20. An induction lamp 200 is secured to the lower edge of the housing 240. The induction lamp 200 transmits light downwardly and away from the housing 240. FIG. 10 better illustrates the induction lamp 200, which in some embodiments, contains a donut-shaped fluorescent bulb.

The invention provides, among other things, a capacitive shield and damping network for common mode noise suppression for switch-mode power converters operating at an RF frequency. Various features and advantages of the invention are set forth in the following claims.

What is claimed is:

1. An induction light ballast module for powering an induction lamp comprising:
   a printed circuit board including an upper layer partitioned into an earth ground region and a printed circuit board ground region, wherein the earth ground region is electrically isolated from the printed circuit board ground region;
   a heat sink disposed on an opposing lower layer of the printed circuit board and electrically connected to the earth ground region of the printed circuit board, the heat sink dimensioned to extend beyond at least one outer edge of the printed circuit board, and wherein a parasitic capacitance occurs between the printed circuit board ground region and the heat sink;
   an alternating current receiving connector and an EMI filter disposed on the earth ground region of the printed circuit board;
   an elongate capacitive shield sandwiched by a lower insulating pad and an upper insulating pad provided on the outwardly opposing faces of the capacitive shield, wherein the capacitive shield and the upper and lower insulating pads are disposed across a length of the heat sink adjacent the at least one edge of the printed circuit board, wherein the capacitive shield is electrically isolated from the heat sink by the lower insulating pad;

a damping network electrically connecting the capacitive shield to the printed circuit board ground region;
a rectifier connected to the EMI filter, wherein the rectifier is disposed on the upper insulating pad adjacent the capacitive shield and electrically isolated from the capacitive shield and the heat sink;
a power factor correction circuit connected to the rectifier and disposed on the printed circuit board ground region, and including switch-mode power conveners disposed on the upper insulating pad adjacent the capacitive shield and electrically isolated from the capacitive shield and the heat sink; and
an output power inverter circuit connected to the switch-mode power converter, the output power inverter circuit being disposed on the printed circuit board ground region and including switch-mode power converters disposed on the upper insulating pad adjacent the capacitive shield and electrically isolated from the capacitive shield and the heat sink,
wherein a parasitic capacitance occurs between the printed circuit board ground region and the heat sink, and wherein the capacitive shield and the damping network provide common mode noise suppression.

2. The induction light ballast module of claim 1, wherein the output from the output power inverter circuit operates at an RF frequency and the damping network comprises at least one of a resistor and a ferrite that dampens resonance and harmonics to minimize incidental RF broadcast by external cables connected to the induction light ballast module.

3. The induction light ballast module of claim 2, further comprising:
a zigbee circuit for wireless communication with other devices;
a flyback circuit for providing power supply voltages to the power factor correction circuit, the output power inverter circuit and the zigbee circuit; and
a controller for operating the circuits and for enabling remote wireless control of the induction light ballast module via the zigbee circuit.

4. The induction light ballast module of claim 1, providing an output power of between approximately 300 watts and approximately 500 watts for driving a lamp.

5. The induction light ballast module of claim 1, wherein the upper layer and the lower layer comprise two of four layers of the printed circuit board.

6. The induction light ballast module of claim 1, wherein the rectifier comprises a bridge rectifier, the switch-mode power converters of the power factor correction circuit comprise four switch-mode power converters, and the switch-mode power converters of the output invertor circuit comprise two switch-mode power converters.

7. The induction light ballast module of claim 1, wherein the damping network and the capacitive shield minimize resonant frequencies incidentally output by the switch-mode power converters.

8. The induction light ballast module of claim 1, wherein the switch-mode power converters comprise output power diodes and field effect transistors.

9. The induction light ballast module of claim 1, further comprising thermally conducting fasteners securing the power converters and the printed circuit board to the heat sink, the fasteners enabling thermal conduction from the power converters to the heat sink.

10. The induction light ballast module of claim 9, further comprising grounding fasteners securing the printed circuit board to the heat sink and electrically connecting the earth ground region of the printed circuit board to the heat sink.

11. The induction light ballast module of claim 1, wherein the switch-mode power converters of the power factor correction circuit comprise two output power diodes and two power factor correction field effect transistors.

12. The induction light ballast module of claim 1, further comprising a temperature sensor for sensing temperature and a controller for controlling operation of the induction light ballast module in response to sensed temperature.

13. The induction light ballast module of claim 1, wherein the induction light ballast module comprises a connected light node induction light ballast module.

14. A connected light node induction light ballast system comprising:
a housing;
a connected light node induction light ballast module disposed in the housing, the connected light node induction light ballast module comprising:
a printed circuit board including an upper layer partitioned into an earth ground region and a printed circuit board ground region, wherein the earth ground region is electrically isolated from the printed circuit board pound region;
a heat sink disposed on an opposing lower layer of the printed circuit board and electrically connected to the earth ground region of the printed circuit board, the heat sink dimensioned to extend beyond at least one outer edge of the printed circuit board, and wherein a parasitic capacitance occurs between the printed circuit board ground region and the heat sink;
an alternating current receiving connector and an EMI filter disposed on the earth ground region of the printed circuit board;
an elongate capacitive shield sandwiched by a lower insulating pad and an upper insulating pad provided on the outwardly opposing faces of the capacitive shield, wherein the capacitive shield and the upper and lower insulating pads are disposed across a length of the heat sink adjacent the at least one edge of the printed circuit board, wherein the capacitive shield is electrically isolated from the heat sink by the lower insulating pad;
a damping network electrically connecting the capacitive shield to the printed circuit board ground region;
a rectifier connected to the EMI filter, wherein the rectifier is disposed on the upper insulating pad adjacent the capacitive shield and electrically isolated from the capacitive shield and the heat sink;
a power factor correction circuit connected to the rectifier and disposed on the printed circuit board ground region, and including switch-mode power converters disposed on the upper insulating pad adjacent the capacitive shield and electrically isolated from the capacitive shield and the heat sink; and
an output power inverter circuit connected to the switch-mode power converter, the output power inverter circuit being disposed on the printed circuit board ground region and including switch-mode power converters disposed on the upper insulating pad adjacent the capacitive shield and electrically isolated from the capacitive shield and the heat sink, and
an induction lamp secured to a bottom of the housing and controlled by the connected light node induction light ballast module, wherein a parasitic capacitance occurs between the printed circuit board ground region and the heat sink, and wherein the capacitive shield and the damping network provide common mode noise suppression.

15. The induction light ballast system of claim 14, wherein the output from the output power inverter circuit operates at an RF frequency of greater than 200 KHz for powering the induction lamp.

16. The induction light ballast system of claim 14, wherein the output from the output power inverter circuit operates at an RF frequency and the damping network comprises at least one of a resistor and a ferrite that dampens resonance and harmonics to minimize incidental RF broadcast by external cables connected to the induction light ballast module.

17. The induction light ballast system of claim 14, wherein the damping network and the capacitive shield minimize resonant frequencies incidentally output by the switch-mode power converters.

18. The induction light ballast system of claim 14, Wherein the connected light node induction light ballast module further comprises a temperature sensor for sensing temperature and a controller for controlling operation of the induction light ballast module in response to sensed temperature.

19. The induction light ballast system of claim 14, wherein the induction light ballast module further comprises:
- a zigbee circuit for wireless communication with other devices:
- a flyback circuit for providing power supply voltages to the power factor correction circuit, the output power inverter circuit and the zigbee circuit; and
- a controller for operating the circuits and for enabling remote wireless control of the induction light ballast module via the zigbee circuit.

* * * * *